Nov. 13, 1962 C. Z. LE MAY ETAL 3,063,876

PREPARATION OF JUNCTIONS IN SILICON CARBIDE MEMBERS

Filed July 10, 1959

WITNESSES

Leon J. Jaza

Charles L. Menzimer

INVENTORS
Charlotte Z. Le May and
Hung Chi Chang
BY
Frederick Shapoe
ATTORNEY

United States Patent Office 3,063,876

Patented Nov. 13, 1962

3,063,876

PREPARATION OF JUNCTIONS IN SILICON CARBIDE MEMBERS

Charlotte Z. Le May, Whitehall Boro, and Hung Chi Chang, Pittsburgh, Pa., assignors to Westinghouse Electric Corporation, East Pittsburgh, Pa., a corporation of Pennsylvania Filed July 10, 1959, Ser. No. 826,189
7 Claims. (Cl. 148—1.5)

Figure 1:
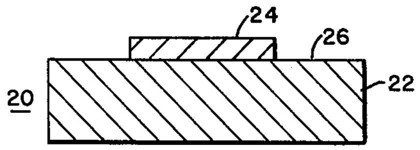

This invention relates to the formation of semiconductor transition regions or junctions in silicon carbide members.

The alloy fusion technique has been widely accepted as a method of producing p-n junctions within a body of semiconductor material. A large number of doping alloys which may be employed with the alloy fusion technique and which are suitable for use with silicon or germanium members are well-known to those skilled in the art. However, generally these alloys are not suitable for use in the production of a p-n junction within a silicon carbide member. The solubility of silicon carbide in most of the well-known doping alloys is extremely low at moderate temperatures and thus a high fusion temperature is necessary in working with silicon carbide. The necessarily high working temperatures lead to the vaporization and decomposition of the alloy during the fusion state, and in some cases to the actual decomposition of the silicon carbide.

An object of the present invention is to provide a new and improved alloy including at least one element selected from the group consisting of platinum, palladium and rhodium and a suitable doping material for the establishing of a semiconductor transition region or junction within a silicon carbide member.

Another object of the present invention is to provide a single crystal silicon carbide member having on at least one surface thereof a fused junction layer including at least one element selected from the group consisting of platinum, palladium and rhodium and a suitable doping material.

Other objects will, in part, be obvious and will, in part, appear hereinafter.

For a better understanding of the nature and objects of the invention, reference should be had to the following detailed description and drawings in which:

FIGS. 1 to 5 inclusive are side views in cross-section of a wafer of silicon carbide being processed in accordance with the teaching of this invention.

In accordance with the present invention and attainment of the foregoing objects there is provided a new and improved alloy including as a major component at least one element selected from the group consisting of platinum, palladium and rhodium and a suitable doping material for the establishing of a semiconductor transition region within a silicon carbide member. In addition to the above stated components, the alloy may contain up to 10%, by weight, of at least one element selected from the group consisting of lead, bismuth, tin and mixtures thereof, and up to 2.0%, by weight, silicon.

The alloy of this invention can be used to form a semiconductor transition region within the silicon carbide member by the alloy fusion technique, the vapor diffusion technique, by flame plating or by any other technique known to those skilled in the art. The invention will be described, however, in terms of forming a semiconductor transition region, within a silicon carbide member, employing the alloy fusion technique.

Generally, in preparing a semiconductor transition region or junction in a silicon carbide member, in accordance with the teachings of this invention, the silicon carbide member and a quantity of the alloy of this invention are placed in close contact, and heated to a temperature sufficient to melt the alloy. The molten alloy spreads over and uniformly wets a specific predetermined portion of the surface of the silicon carbide member upon which it is disposed. The molten alloy dissolves some of the underlying silicon carbide. The entire assembly, comprised of the silicon carbide member and molten alloy, is subsequently cooled causing the dissolved silicon carbide to recrystallize from the alloy melt. The recrystallized silicon carbide has dissolved therein a quantity of the doping material constituent of the alloy. By reason of the doping of the recrystallized silicon carbide a semiconductor transition region or junction exists between the region of the recrystallized silicon carbide and the undissolved portion of the original silicon carbide member.

More specifically, and with reference to FIG. 1, there is illustrated an assembly 20 comprised of a single crystal silicon carbide member 22 in the form of a wafer or die, and a body 24 of a suitable alloy composition in accordance with the invention disposed upon surface 26 of the member 22.

The silicon carbide member 22 may be prepared in accordance with any of the processes known to those skilled in the art, for example by the process set forth in U.S. patent application Serial No. 738,806, filed May 29, 1958, the assignee of which is the same as that of the present invention. The silicon carbide member 22 has a first type of semiconductivity which may be p-, n-, or i-type.

The body 24, which may be in the form of a pellet, foil or the like, is preferably comprised of from 78.5% to 99.5%, by weight, of any one element or mixtures of any two or all three elements selected from the group consisting of platinum, palladium and rhodium; and from 10% to 0.5%, by weight, of a doping material capable of establishing a second type of semiconductivity within a portion of member 22. The alloy may include, for reasons mentioned hereinafter, up to 10% by weight of at least one element selected from the group consisting of lead, tin and bismuth, and also may contain from 0.5% to 2.0%, by weight, silicon.

The doping constituent of the alloy body 24 depends upon the original semiconductivity of member 22 and the desired semiconductivity in the portion to be doped. For example, if member 22 has n-type semiconductivity and it is desired to establish a zone of p-type semiconductivity therein, examples of suitable doping materials include boron, gallium, aluminum and mixtures thereof. If member 22 has a p-type semiconductivity examples of suitable n-type doping materials include antimony, phosphorus, arsenic, nitrogen and mixtures of any two or more thereof. If member 22 is of i-type semiconductivity the doping material may be either of these n- or p-type doping impurities depending upon the desired result.

The permissible minor constituent comprised of at least one element selected from the group consisting of lead, tin and bismuth is added to the alloy to lower its melting point and to improve the wetting of surface 26 of member 22 by the alloy. While this constituent is not a critical component, its presence is desirable.

The addition of up to 2% silicon, and preferably from 0.5 to 2.0%, by weight, of silicon to the alloy compensates for the loss of silicon at fusion temperatures above 1800° C. For this reason the presence of silicon is beneficial, particularly at temperatures exceeding 1800° C., and is quite desirable at 2200° C. and higher, for processing of the silicon carbide bodies.

The surface 26 of member 22 may be lapped, with, for example, finely divided diamond powder or finely divided silicon carbide, or etched with for example a molten salt such as sodium peroxide, to facilitate the introduction of the doping material into member 22.

The assembly 20 of FIG. 1 is supported by a piece of molybdenum or tungsten (not shown) and is disposed in a graphite boat (not shown) and charged into a suitable fusion furnace, for example an A.-C. resistance heated furnace. An inert atmosphere is established within the furnace. The inert atmosphere may be a vacuum, for example a vacuum having an absolute pressure of from $10^{-2}$ mm. Hg to $10^{-5}$ mm. Hg or may be an inert gas atmosphere, for example an argon or helium atmosphere. The temperature of the furnace is then raised to an elevated temperature equal to or above the melting point of the alloy body 24.

Figure 2:
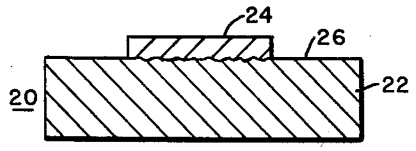

With reference to FIG. 2, as the alloy melts it wets a preselected area of surface 26. The molten alloy 24, immediately upon wetting the surface 26 of member 24, begins to dissolve the silicon carbide underlying the wetted area.

Figure 3:
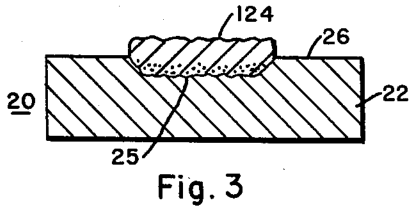

With reference to FIG. 3, as the elevated temperature and inert atmosphere is maintained, the molten alloy progressively dissolves more of the underlying silicon carbide with passage of time. The assembly (as illustrated in FIG. 3) is comprised of the member 22 of silicon carbide, and a molten mass 124 comprised of the molten alloy with some silicon carbide dissolved therein. An interface 25 exists between member 22 and molten mass 124.

The selected elevated or fusion temperature at which the alloy is melted, and to which the silicon carbide member is heated, depends primarily upon the composition of the alloy and the solubility of silicon carbide within this alloy at this temperature. The table below lists suitable fusion temperatures for the particular alloys set forth.

TABLE I

| Alloy composition (weight percent): | Satisfactory fusion temperature range (° C.) |
|---|---|
| 96% Pt–2% Al–2% Sn | 1750–2350 |
| 96% Pt–2% B–2% Sn | 1750–2350 |
| 96% Pt–2% Sb–2% Sn | 1550–2300 |
| 96% Pt–2% Ga–2% Sn | 1600–1800 |
| 96% Rh–2% Ga–2% Sn | 1800–2200 |

Furthermore, the following alloys may be employed at 2000° C.:

90% platinum, 6% rhodium, 2% gallium and 2% lead
90% platinum, 3% palladium, 4% rhodium and 3% gallium
96% platinum, 2% antimony, 1% silicon, 1% tin.

After a predetermined area of surface 26 of member 22 has been wet by the molten alloy, and a predetermined quantity of the silicon carbide underlying the molten alloy has been dissolved, the assembly is cooled from the interface 25 outwardly at a rate of from 50° C. to 500° C. per second while maintaining a temperature gradient so that the interface is cooler than the main part of body 124.

The cooling causes the silicon carbide dissolved within the molten alloy material to recrystallize and deposit on the undissolved silicon carbide body. The recrystallized silicon carbide contains some of the doping constituent derived from the alloy 24. The other constituents of the alloy are segregated by the recrystallizing silicon carbide. The recrystallized zone has a second type semiconductivity relative to the semiconductivity of the original member 22.

Figure 4:
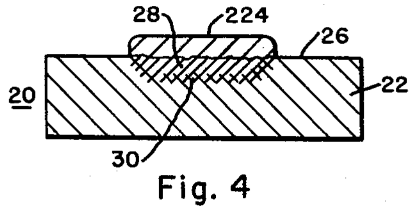

The cooled assembly after such recrystallizing is illustrated in FIG. 4. The assembly of FIG. 4 is comprised of the original silicon carbide member 22, which has a first type of semiconductivity, a recrystallized zone 28 comprised of recrystallized silicon carbide containing the doping constituent and which has a second type semiconductivity relative to the original portion of member 22, and a junction 30 between member 22 and recrystallized zone 28. Junction 30 is a P-N, I-N or I-P junction depending upon the semiconductivity of member 22 and zone 28. The alloy and any excess doping material is disposed above the recrystallized zone 28 and is denoted as 224.

Figure 5:
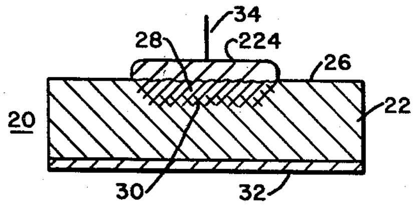

With reference to FIG. 5, ohmic electrical contacts or leads 32 and 34 are affixed to the assembly by brazing, soldering, thermocompression or the like. The assembly of FIG. 5 constitutes a semiconductor diode device suitable for use in various applications.

The following examples are illustrative of the teachings of this invention. All composition percentages are by weight unless otherwise specified.

*Example I*

A foil of an alloy comprised of 96% platinum, 2% boron and 2% tin was disposed upon one surface of an n-type single crystal silicon carbide member (as illustrated in FIG. 1). The assembly, comprised of the silicon carbide member and the foil, supported on a piece of molybdenum, was disposed in a graphite boat and charged into an A.-C. resistance furnace. The furnace was evacuated to an absolute pressure of $10^{-5}$ mm. Hg. The assembly was heated to a temperature of 1850° C. within the inert atmosphere of the furnace. The assembly was maintained at this temperature for 2 minutes. During the two minutes, the foil of alloy melted, wetted a predetermined portion of the surface of the silicon carbide member upon which it was disposed and dissolved a portion of the silicon carbide under the wetted area.

The assembly was then cooled, from the interior of the silicon carbide member outwardly at a rate of 100° C. per second while retained within the inert atmosphere, whereby the dissolved silicon carbide recrystallized.

Examination of the cooled assembly showed it to have a zone of n-type semiconductivity comprised of the original silicon carbide body, a p-type zone comprised of the recrystallized silicon carbide with boron dispersed therein, and a p-n junction between the zone of n-type semiconductivity and the zone of p-type semiconductivity. A layer of resolidified platinum and tin with excess boron was disposed on top of the recrystallized p-type zone.

Metal electrical contacts were affixed to the assembly and the electrical properties determined. The assembly thus prepared was found to have a rectification ratio of 18,000 to 1 at 10 volts at room temperature (75° C.).

*Example II*

The procedure of Example I was repeated with an alloy comprised of 97% platinum, 2.5% boron and 0.5% bismuth and an n-type wafer of silicon carbide. The fusion was carried out at a temperature of 2290° C. in an argon atmosphere for 1.5 minutes.

The assembly thus prepared had a rectification ratio of 50 to 1 at 50 volts.

A plurality of other silicon carbide diodes were prepared with various alloys, following the general procedure of Example I, and the characteristics of the resulting diodes at various temperatures are set forth in Table II.

TABLE II

| Alloy | Fusion Temp., ° C. | Room Temp. Resistivity | Room Temp. | Reverse Leakage, 300° C. | 500° C. |
|---|---|---|---|---|---|
| 2% Al—2% Sn—96% Pt [1] | 2,290 | 20—5×10⁵ ohm-cm | 0.27 ma., 100 volt | | |
| | | | 1.5 ma., 300 volt | | |
| 2% B—2% Sn—96% Pt [1] | 2,240 | 20—5×10⁵ ohm-cm | 0.09 ma., 150 volt | | |
| | | | 0.3 ma., 400 volt | | |
| 2% B—2% Sn—96% Pt [2] | 2,300 | 2—10⁴ ohm-cm | 1.2 ma., 100 volt | 9.0 ma., 100 volt | 13.5 ma., 100 volt. |
| 2% B—2% Sn—96% Pt [2] | 2,300 | 2—10⁴ ohm-cm | 2.1 ma., 50 volt | 14.0 ma., 50 volt | 17.5 ma., 50 volt. |
| 2% B—2% Sn—96% Pt | 2,240 | 2—10⁴ ohm-cm | 0.05 ma., 100 volt | 0.8 ma., 100 volt | |
| | | | 0.2 ma., 275 volt | 3.3 ma., 275 volt | |
| 2% B—2% Sn—96% Pt | 2,220 | 2—10⁴ ohm-cm | 1.0 ma., 100 volt | | |
| 2% B—2% Sn—96% Pt | 1,630 | 8 ohm-cm | 0.02 ma., 100 volt | | |
| 2% B—2% Sn—96% Pt | 1,700 | 2—8 ohm-cm | 0.1 ma., 100 volt | | |

[1] Very slow cooling.
[2] Fused into diffused surface.

While the invention has been described with reference to particular embodiments and examples, it will be understood that modifications, substitutions and the like may be made without departing from its scope.

We claim as our invention:

1. In the process of forming a semiconductor transition region within a single crystal silicon carbide member, the steps comprising applying to the member an alloy consisting essentially of (1) from 90% to 99.5%, by weight, of at least one element selected from the group consisting of platinum, palladium and rhodium and (2) from 10% to 0.5%, by weight, of at least one suitable doping material for producing a desired semiconductivity in a portion of the silicon carbide member, and heating the applied alloy and silicon carbide member to produce a molten area of the alloy which dissolves a portion of the contacting silicon carbide.

2. In the formation of a semiconductor transition region within a single crystal silicon carbide member the steps comprising applying to a surface of the silicon carbide member an alloy consisting essentially of (1) from 80% to 99.5%, by weight, of at least one element selected from the group consisting of platinum, palladium and rhodium, (2) from 10% to 0.5%, by weight, of at least one suitable doping material for producing a desired semiconductivity in a portion of the silicon carbide member, and (3) up to 10%, by weight, of at least one element selected from the group consisting of lead, tin and bismuth and heating the applied alloy and silicon carbide member to produce a molten area of the alloy which dissolves a portion of the contacting silicon carbide.

3. In the formation of a semiconductor transition region within a single crystal silicon carbide member the steps comprising applying to a surface of the silicon carbide member an alloy consisting essentially of (1) from 78.5% to 99.5%, by weight, of at least one element selected from the group consisting of platinum, palladium and rhodium, (2) from 10% to 0.5%, by weight, of at least one suitable doping material for producing a desired semiconductivity in a portion of the silicon carbide member, (3) up to 10%, by weight, of at least one element selected from the group consisting of lead, tin and bismuth and (4) from 0.5% to 2.0%, by weight, silicon and heating the applied alloy and silicon carbide member to produce a molten area of the alloy which dissolves a portion of the contacting silicon carbide.

4. A single crystal silicon carbide member having on at least one surface thereof a fused bonded junction layer consisting essentially of at least one element selected from the group consisting of platinum, palladium and rhodium and a small amount of a suitable doping material capable of producing a desired semiconductivity in a portion of the silicon carbide member.

5. A single crystal silicon carbide member having on at least one surface thereof a fused bonded junction layer consisting essentially of at least one element selected from the group consisting essentially of platinum, palladium and rhodium, a small amount of a suitable doping material capable of producing a desired semiconductivity in a portion of the silicon carbide member, and at least one element selected from the group consisting of lead, tin and bismuth.

6. A single crystal silicon carbide member having on at least one surface thereof a fused bonded junction layer consisting essentially of platinum and a small amount of a suitable doping material for producing a desired semiconductivity in a portion of the silicon carbide member.

7. A single crystal silicon carbide member having on at least one surface thereof a fused bonded junction layer consisting essentially of platinum and a suitable doping material for producing a desired semiconductivity in a portion of the silicon carbide member, and at least one element selected from the group consisting of lead, tin and bismuth.

References Cited in the file of this patent

UNITED STATES PATENTS

| | | |
|---|---|---|
| 2,504,627 | Benzer | Apr. 18, 1950 |
| 2,530,110 | Woodyard | Nov. 14, 1950 |
| 2,847,335 | Gremmelmaier et al. | Aug. 12, 1958 |
| 2,918,396 | Hall | Dec. 22, 1959 |

FOREIGN PATENTS

| | | |
|---|---|---|
| 134,583 | Sweden | Feb. 19, 1952 |
| 1,022,385 | Germany | Jan. 9, 1958 |
| 585,146 | Canada | Oct. 13, 1959 |